Sept. 18, 1962 C. F. ALSING 3,054,840

THERMOPILE

Filed May 6, 1958

INVENTOR
CARL F. ALSING
BY William J. Foley
ATTORNEY

United States Patent Office 3,054,840

Patented Sept. 18, 1962

3,054,840

THERMOPILE

Carl F. Alsing, Wilbraham, Mass., assignor to Westinghouse Electric Corporation, East Pittsburgh, Pa., a corporation of Pennsylvania Filed May 6, 1958, Ser. No. 733,426
2 Claims. (Cl. 136—4)

This invention relates to thermopiles for use in heat pump and electric power generation apparatus.

It is known that, when direct electric current is passed through a series of junctions between elements alternately formed of two materials having dissimilar thermoelectric properties, certain of the junctions will absorb heat and the other junctions will release heat. The phenomenon is generally referred to as the Peltier effect. A reverse effect, known as the Seebeck effect, can also be achieved by heating certain junctions and cooling other junctions to produce a flow of electric current through the series of junctions.

This invention concerns the construction of a thermopile including a series of thermoelectric elements and members for conducting heat to certain of the junctions between these elements and away from other junctions between the elements. The invention is particularly directed to a thermopile structure which can be easily and economically manufactured and which efficiently utilizes the thermoelectric material contained therein.

In accordance with the invention, the thermopile is constructed about an elongated conduit adapted to convey a heat transfer fluid. Concentrically disposed about this conduit is a cylindrical casing which encloses an annular space about the conduit and in which the thermoelectric elements are disposed. The thermoelectric elements are preferably made in the form of rings which are arranged in spaced parallel relation along the aforementioned conduit. The ring-like elements are alternately formed of two materials having dissimilar thermoelectric properties, so that an electric current passed lengthwise through the series of elements will pass first through one material, then the other, then through the first material, etc., creating alternate hot and cold junction points. The electrical junctions between the thermoelectric elements are actually provided by a series of ring-like members of good electrical and thermal conductivity, which also serve to conduct heat away from or to their respective junctions. Certain junction members extend inwardly from the thermoelectric elements and are arranged in heat transfer relation with the conduit. Other junction members extend outwardly of the thermoelectric elements and are arranged in heat transfer relation with the casing. An electric current passing through the series of thermoelectric elements, in effect, causes heat to be transferred between the conduit and the casing via the junction members. Or, if the thermopile is employed for power generation purposes, a temperature differential maintained between the conduit and the casing is transmitted to the thermoelectric elements and a flow of electric current is induced in a circuit including these elements.

While the thermopile constructed in accordance with this invention utilizes a multiplicity of parts, the number of different types of parts is held to a minimum and they are of such a nature as to be easily fabricated and easily assembled to form the finished products.

Other features and advantages of the invention will appear from the following detailed description thereof wherein reference is made to the accompanying drawings, in which.

Figure 1:
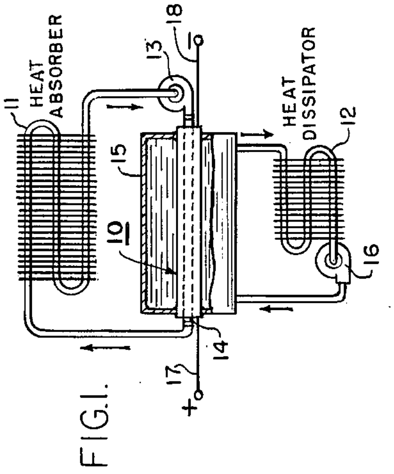
FIG. 1 is a schematic illustration of a heat pump or refrigeration circuit embodying the thermopile of this invention.

Referring in particular to FIG. 1, the simplified heat pump circuit there illustrated shows the manner in which a thermopile 10, constructed in accordance with this invention, can be employed in a domestic refrigerator, an air conditioner, or similar apparatus. The circuit employs two heat exchangers 11 and 12, which are adapted to, respectively, absorb and dissipate heat. A first heat transfer fluid is circulated through the heat absorber 11 by a pump 13 which also conveys this fluid through a conduit 14 passing centrally through the thermopile 10. Heat is pumped by the thermopile 10 from the fluid passing through conduit 14 into another heat transfer fluid in contact with the outer surface of the thermopile and contained within a jacket 15. This second heat transfer fluid is circulated through the jacket 15 and the heat dissipator 12 by another pump 16. In the domestic refrigerator application referred to above, the heat absorber 11 would normally be disposed within the chamber or compartment which is to be refrigerated, and the heat dissipator 12 would be located so as to discharge heat into the air ambient the refrigerator cabinet.

The thermopile 10 is activated by electric current supplied thereto through electrical leads indicated at 17 and 18.

Figure 4:
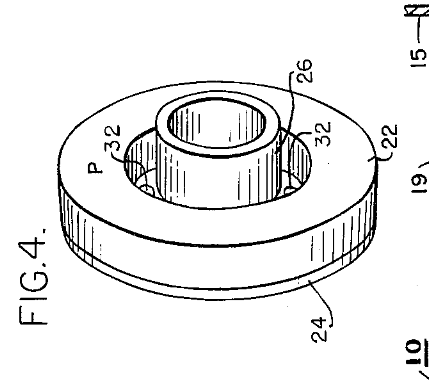
FIG. 4 is a perspective view similar to FIG. 3 but showing another junction member and another thermoelectric element also employed in the thermopile.
Figure 3:
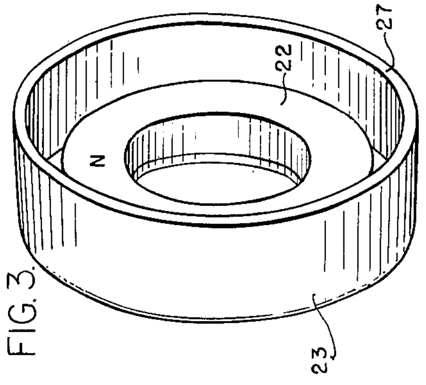
FIG. 3 is a perspective view of a junction member and a thermoelectric element employed in the thermopile shown in FIG. 2.
Figure 2:
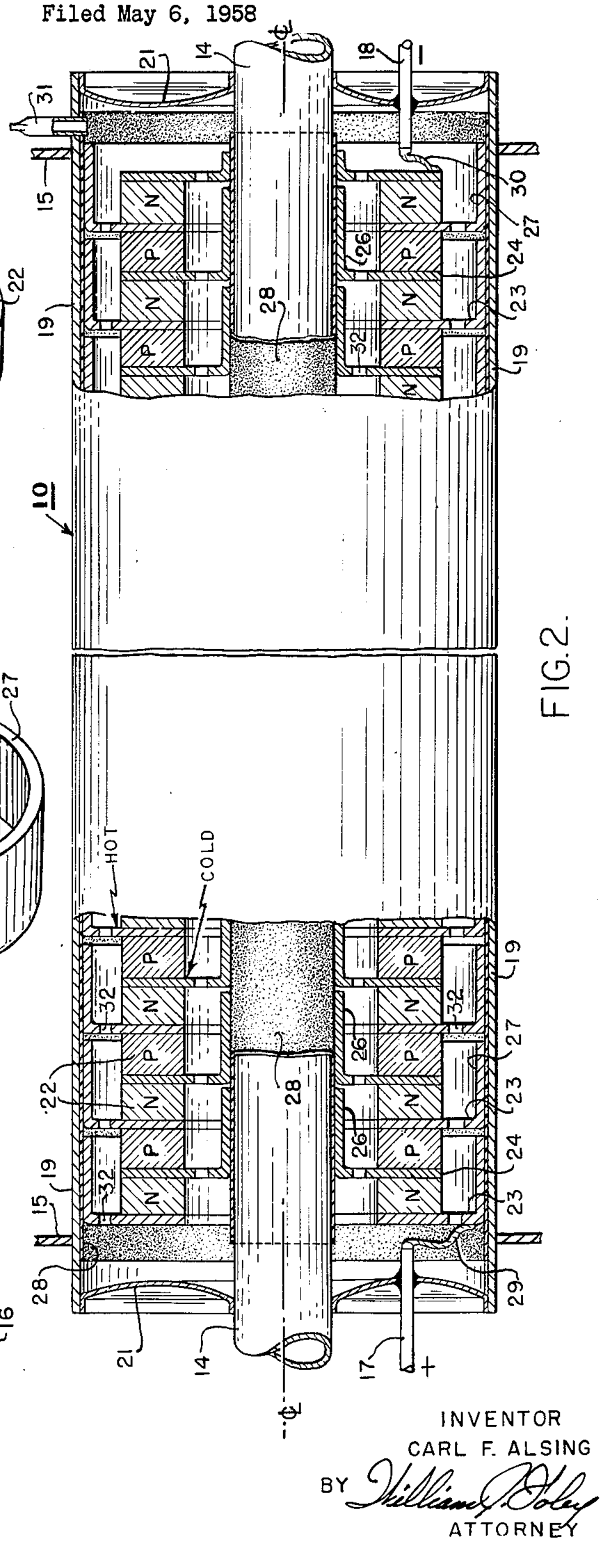
FIG. 2 is an enlarged fragmentary view of the thermopile, partially in section, illustrating its interior construction.

The construction of the thermopile 10 is illustrated in greater detail in FIGS. 2, 3 and 4. It is formed in the shape of an elongated hollow cylinder, including the tubular conduit 14 as its central element. The conduit 14 is preferably made of a material having high heat conductivity, such as copper. The other elements of the thermopile are hermetically sealed within a cylindrical casing 19, concentrically disposed about the conduit 14 and having its ends sealed to the conduit by means of wall membranes 21. The casing is also made of a material having good heat conductivity. Since a temperature differential is maintained between the conduit 14 and the casing 19, the membranes 21 are preferably constructed of thin material having low heat conductivity, such as stainless steel, so as to minimize the transfer of heat from the warmer to the cooler of these members. The membranes 21 can be welded, brazed, or otherwise joined to the casing 19 and the conduit 14 in fluid tight relation thereto.

Disposed within the annular space between the casing 19 and the conduit 14 is a series of thermoelectric elements 22. The elements 22 all preferably have the same configuration, which is generally ring-like, with the elements having flat front and back faces. The elements 22 are, however, alternately formed of two dissimilar thermoelectric materials, such as antimony and busmuth. The elements which are constructed of antimony, or a similar material having positive thermoelectric power characteristics, are identified by the letter P in the drawings. The elements made from bismuth, or a similar material having negative thermoelectric power characteristics, are identified by the letter N. Electric current flowing through a junction of these materials from an N material to a P material will cause that junction to absorb heat, i.e. produce a cooling effect at the junction. Electric current flowing through a junction of these materials from a P material to an N material will cause the junction to dissipate heat. Because the thermoelectric elements 22 are alternately formed of N and P type materials, as shown in FIG. 2, an electric current passing through the series of elements will produce heating and cooling at alternate junctions between the elements.

The electrical junctions or connections between adjacent thermoelectric elements 22 are provided by a plurality of ring-like junction members of two sets or types 23 and 24. The junction members 23 and 24 conduct both heat and electric current and, hence, are made of a material having good electrically and thermally conductive properties, such as copper or aluminum. The larger junction members 23 have both internal and external radial dimensions which are larger than corresponding dimensions of the smaller junction members 24. The external dimensions of the smaller junction members 24 are, however, greater than the internal dimensions of the larger junction members 23, so that the two types of members have portions which overlap one another radially of the center line of conduit 14, which is also the center line of the thermopile. These overlapping portions of members 23 and 24 are disposed within the spaces between adjacent thermoelectric elements 22 so as to form a continuous path for electric current.

The smaller junction members 24 have portions thereof disposed in the cold junctions between the thermoelectric elements 22, extend inwardly from these elements, and have cylindrical flanges 26 at their inner edges which extend parallel to the center line of conduit 14 and surround the conduit in good heat transfer relation therewith. The larger junction members 23 form the hot junctions between the thermoelectric elements 22, have portions thereof extending outwardly from the thermoelectric elements, and have cylindrical flanges at their outer edges which extend parallel to the center line of conduit 14 and are arranged in good heat transfer relation with the thermopile casing 19. The cylindrical flanges 26 and 27 on the junction members provide extended surface areas in heat transfer relation with the conduit 14 and the casing 19 to provide low resistance heat flow paths between the thermoelectric elements 22 and the heat transfer fluids which are circulated in contact with the walls of the conduit 14 and casing 19. It will be noted, however, that the flanges 26 and 27 are spaced slightly from the next junction member of the same type so that there is no shunting of the electric current which passes through the thermoelectric elements.

The thermoelectric elements 22 and the ring-like junction members 23 and 24 are electrically isolated from the conduit 14 and the casing 19 by thin coatings of electrical insulating material 28 disposed on the outer surface of the conduit 14 and the inner surface of the casing 19. These coatings 28 are preferably of a good quality electrical enamel, or the like, and are made as thin as possible in order to minimize interference with heat transfer between the junction members 23 and 24 and the casing 19 and the conduit 14. The thickness of each coating 28 is purposely exaggerated in the drawings to clarify the illustration. Actually, an effective insulating coating need be only a few thousands of an inch thick.

The thermopile 10 can be assembled quite easily. The thermoelectric elements 22 are preferably pre-assembled to the junction members 23 and 24 as shown in FIGS. 3 and 4. Each element of one type of thermoelectric material, say the N type, is joined to a large junction member 23, and each element of P material is joined to a smaller junction member 24. The joining can be accomplished by soldering, brazing, welding or other means establishing good electrical contact between the elements and members. A number of the two sub-assemblies shown in FIGS. 3 and 4 are alternately slid over the conduit 14 until a series of the desired length is obtained. The other abutting faces of the thermoelectric elements 22 and the junction members 23 and 24 are then joined, as by brazing, or welding, or the like, or the several subassemblies can be clamped tightly together by suitable means (not shown), to establish good electrical contact between each of the thermoelectric elements and its abutting junction members. Thereafter, the casing 19 is assembled over the cylindrical flanges 27 of the larger junction members 23, the electrical supply leads 17 and 18 are joined to the endmost junction members, preferably by flexible leads 29 and 30, and the wall membranes 21 are sealed in place. The electric supply leads 17 and 18 are preferably sealed to and insulated from the wall membranes 21, as by means of glass seals.

The space between the casing 19 and the conduit 14 is preferably evacuated through a pinch-off tube 31 after the thermopile is assembled, so as to reduce oxidation or other deterioration of the electrical connections between the thermoelectric elements 22 and the junction members 23 and 24, and to reduce convectional transfer of heat between the conduit 14 and the casing 19. Each of the junction members has at least one opening 32 therein to permit air to escape from between the members during evacuation of the thermopile.

With electric current flowing through the thermopile from the positive lead 17 to the negative lead 18, heat will be absorbed from the conduit 14 and dissipated through the walls of the casing 19. By reversing the direction of current, the direction of heat flow can be reversed so that heat is absorbed through the casing 19 and dissipated into the conduit 14. Thus, the thermopile 10 of this invention can be utilized, not only in the refrigeration circuit illustrated in FIG. 1 but also in similar circuits wherein the functions of the heat absorber 11 and the heat dissipator 12 are reversed.

For power generation purposes, the thermoelectric elements 22 can be stimulated to generate electrical energy by maintaining the conduit 14 and the casing 19 at different temperatures. For example, if the casing 19 is maintained at a temperature which is elevated with respect to the temperature of the conduit 14, this temperature differential will be transferred to the thermoelectric elements 22 by the junction members 23 and 24 and electric current will flow from the positive lead 17, through the thermopile, out the negative lead 18, and on through a load circuit connected to the thermopile. Maintaining the conduit 14 at a higher temperature than the casing 19 will cause the thermoelectric elements 22 to generate a current flowing in the opposite direction.

The versatility of the thermopile of this invention should, therefore, be apparent from the several applications therefor referred to above. It will also be noted that the novel structural arrangement of the components of the thermopile provides for adequate protection of the thermoelectric junctions and elements from corrosion and deterioration. Direct contact of the heat transfer fluids or the atmosphere with the thermoelectric elements 22 is avoided by sealing these elements into a closed casing. On the other hand, adequate heat transfer between the fluids and the thermoelectric elements is assured by the novel arrangement of the junction members 23 and 24. Moreover, these objectives are accomplished in a structure which can be manufactured easily and economically.

While the invention has been shown in but one form, it will be obvious to those skilled in the art that it is not so limited, but is susceptible of various changes and modifications without departing from the spirit thereof.

What is claimed is:

1. A thermopile comprising a tubular conduit adapted to convey a heat transfer fluid, a tubular casing concentrically disposed along said conduit in spaced encompassing relation thereto, a plurality of annular members of electrically and thermally conductive material, said members being of two types alternately arranged in spaced parallel relation between said conduit and said casing, the members of one of said types having relatively larger internal and external radial dimensions than the members of the other type, the members of said one type having annular flange portions at the outer edges thereof arranged in heat transfer relation with said casing the members of said other type having annular flange portions at the inner edges thereof arranged in heat transfer relation with said conduit, the members of said one type having inner portions thereof which radially overlap outer portions of the members of the other type, and a series of elements alternately formed of two materials having dissimilar thermoelectric properties, the elements of said series being disposed between said overlapping portions of said members and radially spaced from the flange portions of said members, said elements and said bodies forming a path for electric current.

2. The structure recited in claim 1 and further including a pair of annular wall membranes disposed adjacent opposite ends of said casing and extending inwardly therefrom into abutment with said conduit, said membranes being in fluid tight relation with said casing and said conduit and together therewith forming a closure for said elements and members.

References Cited in the file of this patent

UNITED STATES PATENTS

| | | |
|---|---|---|
| 197,196 | Wray et al. | Nov. 13, 1877 |
| 1,120,781 | Alten Kirch et al. | Dec. 15, 1914 |
| 1,848,655 | Petrik | Mar. 8, 1932 |
| 2,480,404 | Findley et al. | Aug. 30, 1949 |
| 2,543,331 | Okolicsanyi | Feb. 27, 1951 |
| 2,685,608 | Justi | Aug. 3, 1954 |
| 2,749,716 | Lindenblad | June 12, 1956 |
| 2,811,568 | Lloyd | Oct. 29, 1957 |
| 2,857,446 | Imelmann | Oct. 21, 1958 |
| 2,881,594 | Hopkin | Apr. 14, 1959 |
| 2,884,762 | Lindenblad | May 5, 1959 |
| 2,919,553 | Fritts | Jan. 5, 1960 |
| 2,944,404 | Fritts | July 12, 1960 |

FOREIGN PATENTS

| | | |
|---|---|---|
| 6,869 | Great Britain | May 21, 1886 |
| 371,523 | France | Nov. 9, 1907 |
| 463,726 | Germany | Aug. 6, 1928 |